United States Patent [19]

McClintock et al.

[11] Patent Number: 5,705,939
[45] Date of Patent: *Jan. 6, 1998

[54] PROGRAMMABLE LOGIC ARRAY INTEGRATED CIRCUITS WITH SEGMENTED, SELECTIVELY CONNECTABLE, LONG INTERCONNECTION CONDUCTORS

[75] Inventors: Cameron McClintock, Mountain View; Richard G. Cliff, Milpitas; William Leong, San Francisco, all of Calif.

[73] Assignee: Altera Corporation, San Jose, Calif.

[*] Notice: The term of this patent shall not extend beyond the expiration date of Pat. No. 5,614,840.

[21] Appl. No.: 730,351

[22] Filed: Oct. 15, 1996

Related U.S. Application Data

[63] Continuation of Ser. No. 443,119, May 17, 1995, Pat. No. 5,614,840.

[51] Int. Cl.[6] .................................................. H03K 19/177
[52] U.S. Cl. .......................................... 326/41; 326/39
[58] Field of Search ...................................... 326/39–41

[56] References Cited

U.S. PATENT DOCUMENTS

| | | | |
|---|---|---|---|
| Re. 34,363 | 8/1993 | Freeman | 307/165 |
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,758,745 | 7/1988 | Elgamal et al. | 307/465 |
| 4,774,421 | 9/1988 | Hartmann et al. | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,121,006 | 6/1992 | Pedersen | 307/465 |
| 5,220,214 | 6/1993 | Pedersen | 307/465 |
| 5,260,610 | 11/1993 | Pedersen et al. | 307/465 |
| 5,260,611 | 11/1993 | Cliff et al. | 307/465 |
| 5,274,581 | 12/1993 | Cliff et al. | 364/784 |
| 5,350,954 | 9/1994 | Patel | 307/465 |
| 5,371,422 | 12/1994 | Patel et al. | 326/41 |
| 5,541,530 | 7/1996 | Cliff et al. | 326/41 |
| 5,543,732 | 8/1996 | McClintock et al. | 326/41 |
| 5,614,840 | 3/1997 | McClintock et al. | 326/41 |

FOREIGN PATENT DOCUMENTS

WO 95/04404  9/1995  WIPO ................. H03K 19/177

OTHER PUBLICATIONS

R. C. Minnick, "A Survey of Microcellular Research," Journal of the Association for Computing machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Develoments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEe Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

*Primary Examiner*—David B. Hudspeth
*Attorney, Agent, or Firm*—Fish & Neave; Robert R. Jackson

[57] ABSTRACT

A programmable logic array integrated circuit device has regions of programmable logic grouped in blocks disposed on the device in a two-dimensional array of intersecting rows and columns. Each block includes a relatively small number of logic regions to reduce the size and complexity of the local feedback circuitry required in the block. Interconnection conductors extend along each row and column of blocks. Some of these conductors are segmented along their length to permit independent use of each segment. When longer interconnections are required, however, adjacent segments can be interconnected by programmable bi-directional switches between the segments.

3 Claims, 4 Drawing Sheets

PROGRAMMABLE LOGIC ARRAY INTEGRATED CIRCUITS WITH SEGMENTED, SELECTIVELY CONNECTABLE, LONG INTERCONNECTION CONDUCTORS

This is a continuation of application Ser. No. 08/443,119, filed May 17, 1995 (now U.S. Pat. No. 5,614,840) entitled PROGRAMMABLE LOGIC ARRAY INTEGRATED CIRCUITS WITH SEGMENTED, SELECTIVELY CONNECTABLE, LONG INTERCONNECTION CONDUCTORS.

BACKGROUND OF THE INVENTION

This invention relates to programmable logic array integrated circuits, and more particularly to improved organizations of the logic regions and interconnection conductors of such devices.

Several different "architectures" for programmable logic array devices are known. Pedersen et al. U.S. Pat. No. 5,260,610, for example, shows programmable logic array devices in which blocks of programmable logic regions are disposed on the device in a two-dimensional array of intersecting rows and columns of such blocks. Each block includes a plurality of logic regions and a plurality of local feedback conductors for making the output of any logic region in the block selectively available as an input to any logic region in that block. Global horizontal conductors are associated with each row of blocks for conveying signals between the blocks in that row. Global vertical conductors are associated with each column of blocks for conveying signals from row to row.

The Pedersen et al. architecture has many advantages such as relatively high-speed signal conduction due to the continuous, long, global horizontal and vertical conductors. In some applications, however, this architecture may have certain disadvantages. For example, the blocks are relatively large (e.g., 16 logic regions each), so that relatively large numbers of switches are required in the local feedback circuitry in each block to make the output of each logic region available as a possible input to any logic region in the block. Another possible disadvantage is that any interconnection between blocks uses up at least one global conductor, even though the interconnection may be relatively short (e.g., just to an adjacent block). Also, because the logic region inputs are fed directly from the global horizontal conductors, each global horizontal conductor has many programmably switchable taps along its length. These taps cause significant loading of the global horizontal conductor circuits, which tends to increase the power required to drive those circuits and also tends to make those circuits not as fast as they would be with fewer programmable taps.

An architecture which addresses some of the possible disadvantages of the Pedersen et al. architecture is shown in Cliff et al. U.S. Pat. No. 5,260,611. The Cliff et al. architecture reduces the number of switchable taps on the global horizontal conductors by tapping those conductors to block input conductors associated with each block, the number of such taps and the number of block input conductors associated with each block being less than the total number of inputs to the logic regions in the block. Each block input conductor is programmably selectively connectable to any logic region input in the block.

Although the Cliff et al. architecture thus offers some possible improvements over the Pedersen et al. architecture, it does not improve on the Pedersen et al. architecture in other respects. The Cliff et al. architecture still requires an entire global horizontal or vertical conductor to be used for even relatively short interconnections between blocks. And the Cliff et al. architecture still requires that relatively large switch matrices be provided in each block to make the output of each logic region in the block available as an input to any logic region in the block (although Cliff et al. do show reducing the number of logic regions in a block from 16 to eight).

A very different type of architecture is shown in Freeman U.S. Pat. No. Re. 34,363. In this architecture short interconnection conductors adjacent to each logic region are programmably interconnectable to one another to make interconnections between any but the most closely adjacent logic regions. A possible disadvantage of this architecture is that large numbers of short conductor segments must be "pieced together" to make long interconnections, which tend to be relatively slow due to the large number of programmable switches that the interconnection signal must pass through. More recent commercial products of Freeman's assignee, Xilinx, Inc., have added longer, uninterrupted conductors, and also uninterrupted conductors between adjacent logic regions (see, for example, Carter U.S. Pat. No. 4,642,487). However, these products still rely heavily on piecing together many relatively short interconnection conductor segments to make certain kinds of interconnections.

Another architecture which relies on programmably piecing together axially aligned and adjacent conductors to make longer conductors is shown in El Gamal et al., "An Architecture for Electrically Configurable Gate Arrays," IEEE Journal of Solid-State Circuits, Vol. 24, No. 2, April 1989, pp. 394–98; El-Ayat et al., "A CMOS Electrically Configurable Gate Array," IEEE Journal of Solid-State Circuits, Vol. 24, No. 3, June 1989, pp. 752–62; and Elgamal et al. U.S. Pat. No. 4,758,745). This architecture is not reprogrammable. Thus it uses one-time-only programmable connection elements that tend to be smaller and have less circuit loading and signal delay than typical reprogrammable connection elements. With such small one-time-only programmable elements it may be acceptable to provide excess interconnection capacity (e.g., regions of interconnection which are very densely or even fully populated with programmable connection elements) and to rely extensively on piecing together multiple short conductors to make longer conductors. But when a device is to be made reprogrammable, the larger size, loading, and delay of reprogrammable connection elements puts much greater pressure on the device designer to economize as much as possible on the use of such elements, without, of course, unduly sacrificing flexibility in the use of the resulting device. Similar economies are also of interest in connection with one-time-only programmable devices, especially as the logic capacity of those devices increases.

In view of the foregoing, it is an object of this invention to provide improved organizations for the logic regions and interconnection conductors of programmable logic array integrated circuit devices.

It is a more particular object of this invention to provide programmable logic array integrated circuit devices which include groups or blocks of logic regions with local feedback but without the need for large programmable switch or logic connector matrices in the feedback circuitry, and which do not always require the use of a long, global conductor to make interconnections between blocks.

SUMMARY OF THE INVENTION

These and other objects of the invention are accomplished in accordance with the principles of the invention by providing programmable logic array integrated circuit devices in which the number of logic regions in a block is reduced (e.g., from eight to four) as compared to the above-mentioned Cliff et al. architecture. The programmable logic connector switch matrix required in the feedback circuitry in each block can then be reduced in size (e.g., from 4×8=32 to 4×4=16 programmable switches per logic region). Reducing the size of each block tends to increase the need for interconnections between blocks. The consequent increased demand for longer interconnection conductors is accommodated more efficiently by segmenting at least some of the long global conductors. Each segment of such a conductor can then be used independently of the other segments. Or if a longer interconnection is needed, axially adjacent segments of a conductor can be programmably interconnected to produce the required longer interconnection conductor.

The size of the switch matrix on the input side of the logic regions can be further reduced by making it only partly populated (e.g., with respect to the connections that can be made from the feedback conductors to the logic region input terminals). The resulting loss of generality on the input side can be at least partly compensated for by providing additional switching on the output side which allows the output signals of the various logic regions in a block to be swapped for one another.

Further features of the invention, its nature and various advantages, will be more apparent from the accompanying drawings and the following detailed description of the preferred embodiments.

DETAILED DESCRIPTION OF THE PREFERRED EMBODIMENTS

Figure 1:
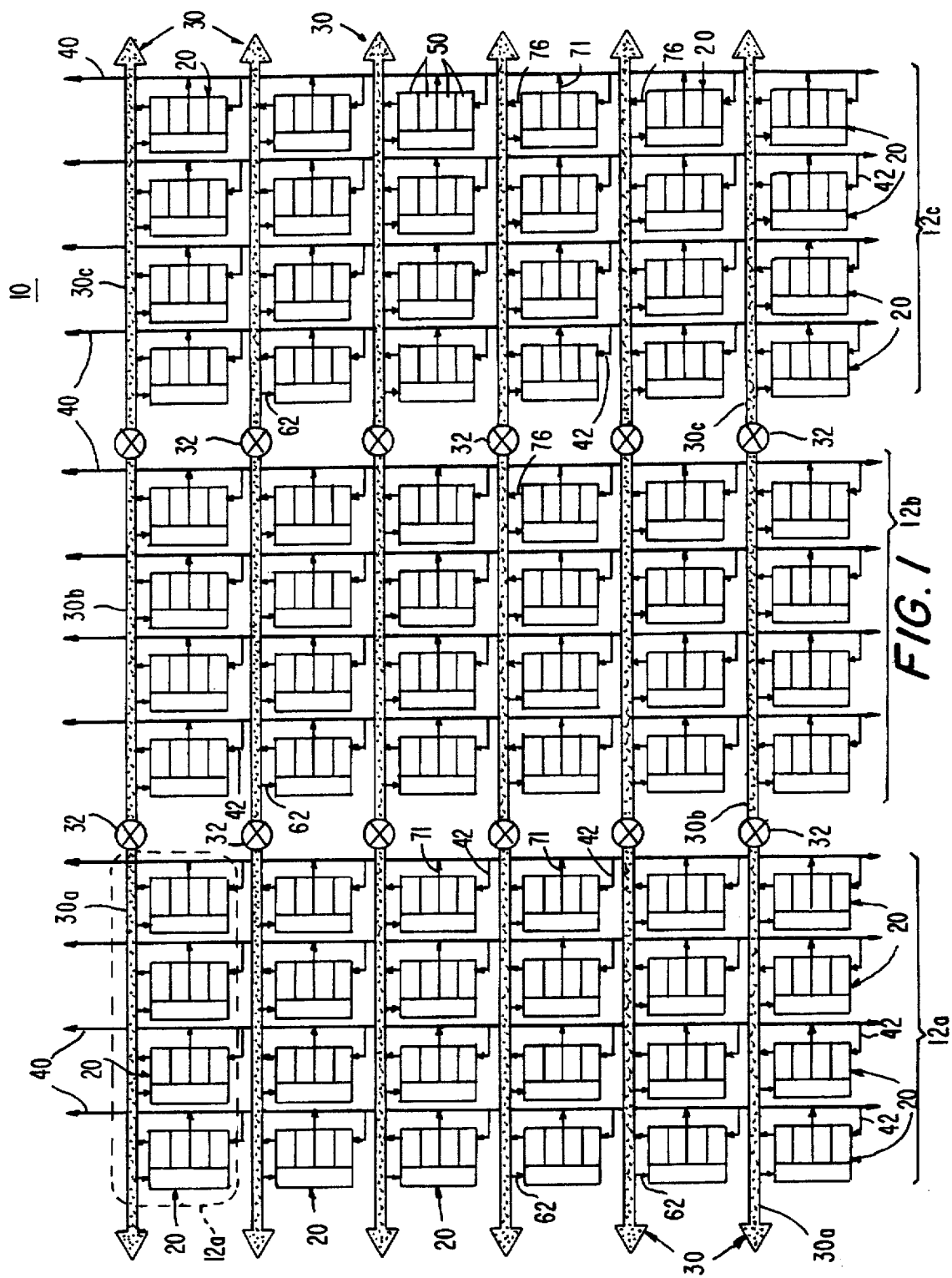
FIG. 1 is a simplified, partial, schematic block diagram of an illustrative programmable logic array integrated circuit device constructed in accordance with the principles of this invention.

As shown in FIG. 1, an illustrative programmable logic array device 10 constructed in accordance with the principles of this invention includes 72 logic region blocks 20 disposed in a two-dimensional array of six horizontal rows and 12 intersecting vertical columns of blocks. The blocks 20 in each row are divided into three sub-rows 12a, 12b, and 12c of four horizontally adjacent blocks each. Sub-rows 12a, 12b, and 12c are sometimes referred to generically as sub-rows 12.

There are 37 horizontal conductor channels 30 adjacent to and associated with each row of blocks 20. Each horizontal conductor channel is segmented into three axially aligned segments 30a, 30b, and 30c, each segment being adjacent to and associated with a respective one of sub-rows 12a, 12b, and 12c. A programmable logic connector ("PLC") 32 is provided between horizontally adjacent segments in each channel 30. Each such PLC 32 allows the associated horizontally adjacent conductor segments to be either electrically isolated from one another (and therefore independently usable) or bi-directionally electrically connected to one another, depending on the programmed state of the PLC.

PLCs 32 (and other PLCs used throughout device 10) can be implemented in any of many different ways. For example, each PLC can be a relatively simple programmable connector such as a switch or a plurality of switches for connecting one or more inputs to an output. Or each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Because the connection capabilities of PLCs tend to be of basic importance in relation to the present invention, these devices will sometimes be referred to herein as switches, switch matrices, or the like, even though it will be understood that in some embodiments the PLCs may additionally perform logic as has been explained. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not separately shown in the drawings. (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. Any of these various technologies can also be used for the programmable memories of logic regions 50 (described below). Thus, this invention is applicable both to one-time-only programmable devices and to reprogrammable devices. However, the especially preferred embodiments are reprogrammable because reprogrammable devices tend to benefit more from the economies of interconnection resources which result from use of this invention.

There are eight global vertical conductors 40 adjacent to and associated with each vertical column of blocks 20.

Figure 2:
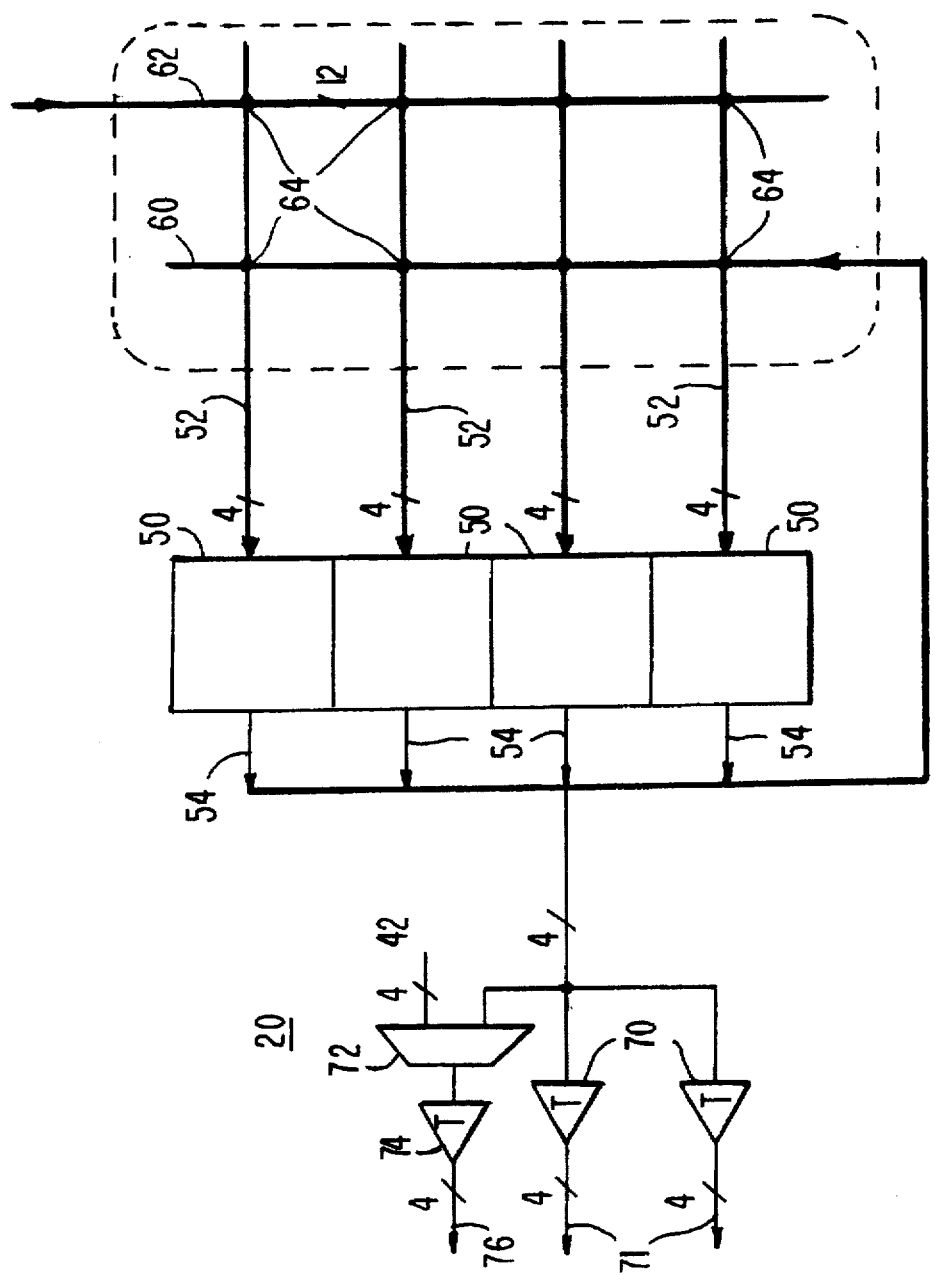
FIG. 2 is a more detailed schematic block diagram of a representative portion of the apparatus shown in FIG. 1.

A representative logic region block 20 is shown in more detail in FIG. 2. (FIG. 2 is oriented differently, left to right, than the blocks 20 shown in FIG. 1.) As shown in FIG. 2, each block 20 includes four logic regions 50. Each logic region 50 has four inputs 52 and an output 54. Each logic region is independently programmable to produce as its output signal 54 any one of a plurality of logical functions of its input signals 52. For example, each logic region 50 may include a programmable four-input universal logic block ("ULB") (e.g., a four-input look-up table) for producing any desired combinational output of its four inputs. Each logic region 50 may also include a selectively by-passable flip-flop for selectively registering the combinational output if desired. A somewhat more detailed depiction of a suitable logic region 50 is shown in McClintock et al. U.S. Pat. No. 5,543,732.

The above-described construction of logic regions 50 is only illustrative, and those skilled in the art will appreciate that many other logic region constructions are possible. For example, logic regions 50 could alternatively be implemented as product-term-based macrocells. As another illustration of possible modifications, each logic region 50 could also include specialized circuitry to facilitate the performance of arithmetic and/or counter functions as shown, for example, in Cliff et al. U.S. Pat. No. 5,274,581.

Figure 3:
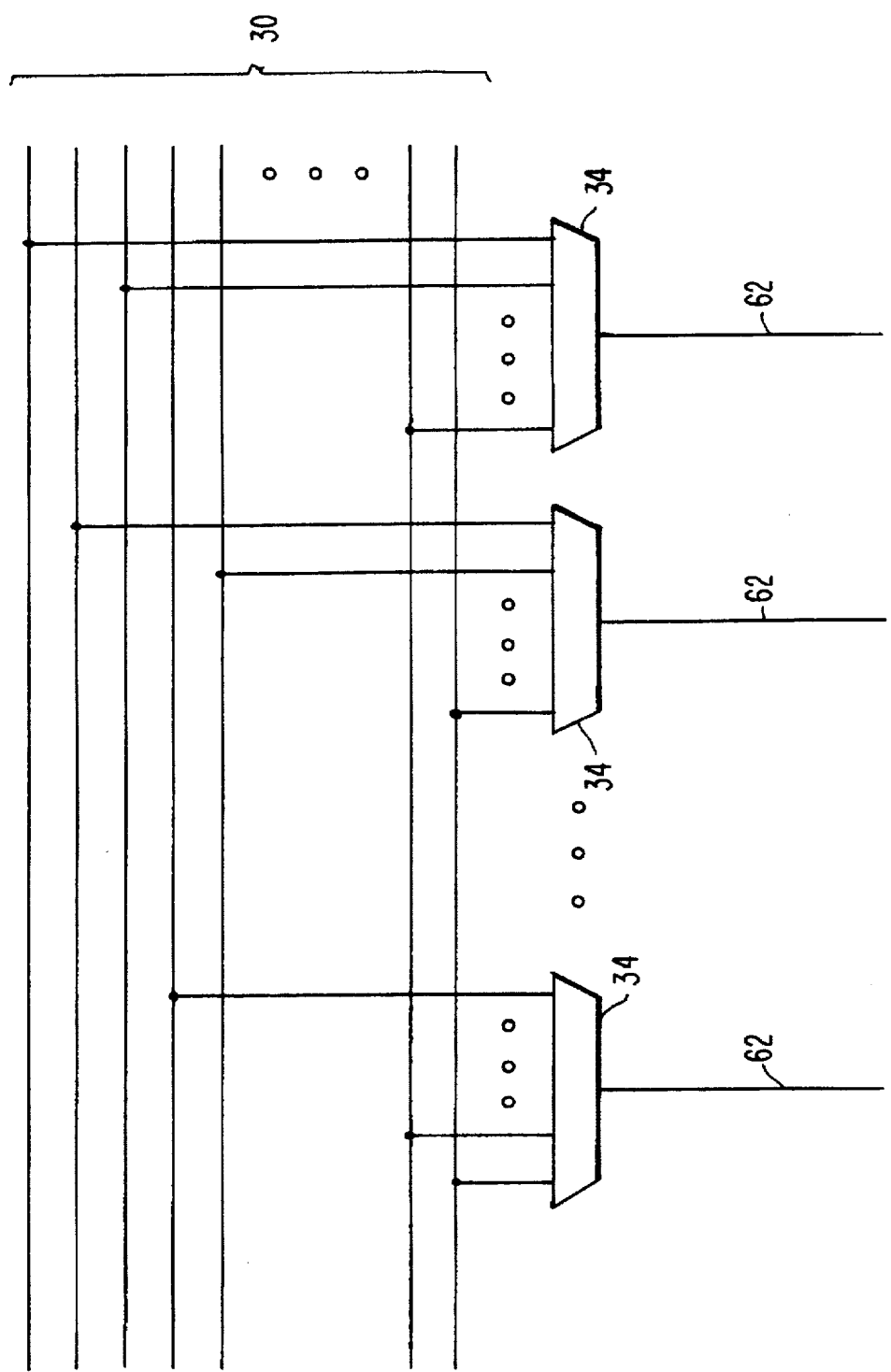
FIG. 3 is another more detailed schematic block diagram of another representative portion of the apparatus shown in FIG. 1.

The output signal of each logic region 50 is applied to a respective one of four feedback conductors 60 associated with the block 20 including that logic region. Each block 20 also has 12 block feeding input conductors 62. As shown in FIG. 3, each of conductors 62 can receive a signal from any selected one of an associated subset of the horizontal conductors 30 adjacent to the block including that conductor 62. This is preferably done via PLCs 34, each of which has inputs connected to an associated subset of conductors 30 and an output which is the associated conductor 62. In the depicted preferred embodiment each PLC 34 is programmable to connect any one of its inputs to its output. The subsets of conductors 30 to which conductors 62 are thus connectable are preferably distributed so that the signal on each conductor 30 has two ways to get into each associated logic block 20. Providing multiple ways for the signal on each horizontal conductor 30 to get into each block 20 helps reduce the risk that any signal needed by a block will be blocked, even though there are far fewer block feeding conductors 62 than there are horizontal conductors 30 adjacent to each block.

Each of the four inputs 52 to each logic region 50 is programmably connectable to any one of local feedback conductors 60 and block feeding conductors 62. Again this can be accomplished using PLCs (represented by the large dots 64 in FIG. 2). The inputs of each PLC 64 are then connected to conductors 60 and 62, and its output is an input 52 to a logic region 50. In the depicted preferred embodiment each PLC 64 is programmable to connect one of its input to its output.

The output signal 54 of each logic region 50 is also selectively applyable to either or both of two global vertical conductors 40 adjacent to the block 20 which includes that logic region. This is done via tri-statable drivers 70, the states of which are programmably controlled. (Each element 70, 72, and 74 shown in FIG. 2 actually represents four such devices, one for each of the four associated logic regions 50.) The eight outputs 71 of the eight tri-statable drivers 70 are distributed over the eight global vertical conductors 40 adjacent to the block 20 that includes those drivers.

The output signal 54 of each logic region 50 in a block 20 can also be applied to one of the horizontal conductors 30 adjacent to that block via a PLC 72, a programmable tri-state driver 74 (similar to drivers 70), and a connection 76. Each PLC 72 alternatively allows the associated driver 74 to be used to apply the signal 42 on one of the adjacent vertical conductors 40 to the horizontal conductor 30 connected to that driver 74. Elements 72 and 74 can thus be used to make connections from adjacent global vertical conductors 40 to adjacent horizontal conductors 30. The outputs of the four drivers 74 associated with a block are respectively applied to four different horizontal conductors 30.

Figure 4:
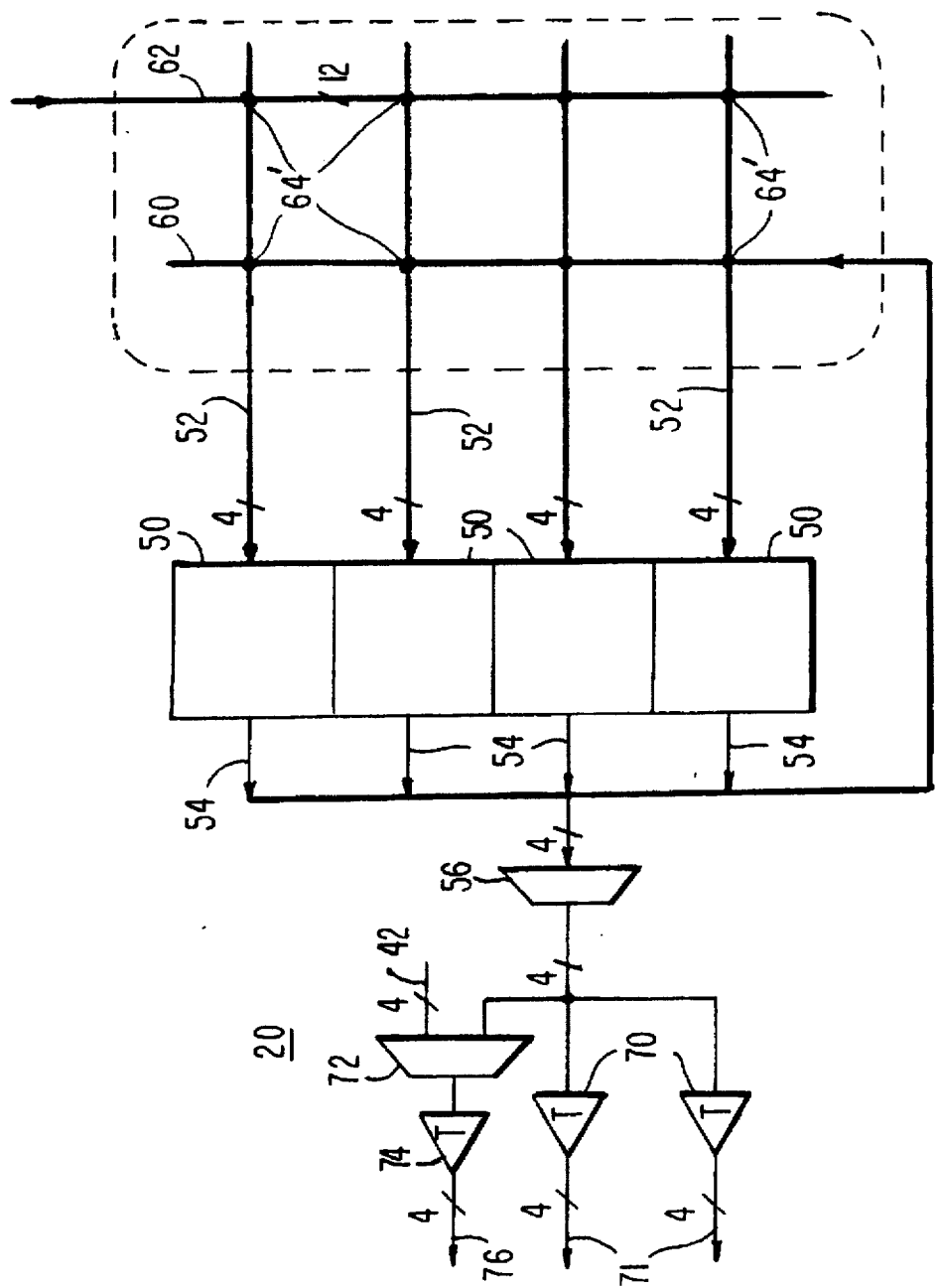
FIG. 4 is similar to FIG. 2 but shows a possible alternative embodiment in accordance with this invention.

FIG. 4 shows a possible alternative to the structure shown in FIG. 2 in accordance with this invention. In this alternative each PLC 64' has only a partial population of input connections from conductors 60 and 62. For example, each logic region input 52 may be connectable to only half of conductors 60 and half of conductors 62. To make up for this loss of complete generality on the input side of logic regions 50, a PLC network 56 is added on the output side of regions 50. Network 56 has four inputs and four outputs, and is programmable to connect any of its inputs to any of its outputs. In this way if a particular logic region 50 does not have the PLC 64' inputs needed to enable that logic region to perform a particular logic task, but another region 50 does have the PLC 64' inputs required for that task, the second region 50 can be used and its output switched via PLC 56 to the elements 70, 72, and 74 that normally serve the first region 50.

Connections to and from the chip are made via PLCs (which may include tri-state drivers) connected between conductors 30 and 40 and input and/or output pads disposed along the edges of the chip. This is not shown herein, but it may be similar to what is shown, for example, in FIGS. 6a and 6b of Cliff et al. U.S. Pat. No. 5,260,611. Also, although not shown herein, it will be apparent to those skilled in the art that additional conductors can be provided on device 10 to supply various clock, clear, preset, etc. signals to logic regions 50.

The operation and advantages of the foregoing structure will be apparent from what has been said regarding it. Interconnections among the logic regions 50 in each block 20 can be provided via local feedback conductors 60 without going outside the block. The reduced number of logic regions 50 in each block (as compared to the larger blocks in the prior Cliff et al. architecture) reduces the number of programmable switches 64 needed between conductors 60 and 52. Input signals come into each block 20 via its conductors 62. Again, because each block 20 has fewer logic regions 50, the number of conductors 62 needed for each block is less, and the number of switches 64 needed for connecting such conductors to inputs 52 can also be less, than in the above-mentioned Cliff et al. architecture. Signals routed on local feedback lines 60 or block feeding conductors 62 tend to be faster because of reduced loading on those conductors. As mentioned above, the alternative shown in FIG. 4 can be used to reduce the number of switches in PLCs 64/64' even further by having each conductor 52 connectable to only some of conductors 60 and 62. More programmable switches can be cut out of PLCs 64/64' in this way than are added by PLC network 56, which is at most only a relatively small (e.g., 4 by 4) cross-point switch.

Segmenting each horizontal conductor channel 30 into three segments 30a, 30b, and 30c permits more efficient use of the horizontal conductor resource. If an interconnection is needed between two blocks 20 in one sub-row 12a, 12b, or 12c of blocks, only one segment of a conductor channel 30 must be used to make that interconnection. The other two segments of that conductor channel remain available for use in making connections within or possibly between the other two sub-rows of blocks. When an interconnection is needed between blocks 20 in two horizontally adjacent sub-rows 12 of blocks, two horizontally adjacent segments of a conductor channel 30 are bi-directionally connected by appropriately programming the PLC 32 between those segments. The third segment in that channel 30 is still free for independent use to make an interconnection between blocks 20 in the third sub-row. If a very long interconnection is needed between the left-most and right-most sub-rows 12, then all three segments in a channel 30 are bi-directionally connected by appropriately programming both PLCs 32 in that channel 30.

Signals with various amounts of fan out are accommodated in the same way that interconnections of various length are made. For example, relatively low fan out may be accomplished using only one segment of a conductor channel 30. If greater fan out is needed, two or all three segments of a channel 30 may be used.

As long as a signal is routed on only one segment of a channel 30, signal propagation tends to be faster than in the above-mentioned Cliff et al. architecture because one such segment spans only four blocks 20 and is therefore relatively lightly loaded.

Stitching segments 30 together via PLCs 32 may tend to somewhat slow down signal propagation as compared to propagation along uninterrupted conductors as in the Pedersen et al. and Cliff et al. architectures, but this penalty is relatively small since the number of segments in each channel 30 is relatively small. Thus the maximum delays are nowhere near as great as the maximum delays that may occur using the Freeman architecture in which very large numbers of conductor segments may be needed to make long interconnections. The same is true of a comparison between the present architecture and the architecture shown in the above-mentioned El Gamal, El-Ayat, and Elgamal references.

It will be apparent that the foregoing is only illustrative of the principles of this invention, and that various modifications can be made by those skilled in the art without departing from the scope and spirit of the invention. For example, the total number of logic region blocks 20 on the device can be increased or decreased. The numbers of rows and columns of blocks 20 can also be increased or decreased, with appropriate modification of the numbers of associated horizontal and vertical conductors 30 and 40. The number of segments in each channel 30 does not have to be three, but could be two or more than three, although it is not desirable to use too many segments in view of the speed penalty that may result. Vertical conductors 40 could be segmented in the same way that has been described for horizontal conductors 30.

The invention claimed is:

1. A programmable logic array integrated circuit device comprising:

a plurality of logic regions, each of which has a plurality of input terminals and at least one output terminal, and each of which is programmable to produce at its output terminal an output logic signal which is any of a plurality of logic functions of input logic signals applied to its input terminals, said logic regions being grouped in a plurality of blocks of said logic regions such that each of said blocks includes a respective subplurality of adjacent ones of said logic regions, said blocks being disposed on said integrated circuit in a two-dimensional array of intersecting rows and columns of said blocks, each of said rows being subdivided into a plurality of sub-rows of said blocks such that each of said sub-rows includes a respective subplurality of adjacent ones of said blocks in the row of which that sub-row is a part;

a plurality of sub-row conductors associated with each of said sub-rows, each of said sub-row conductors extending along the length of the associated sub-row;

a plurality of column conductors associated with each of said columns, each of said column conductors extending along the length of the associated column;

a plurality of block feeding conductors associated with each of said blocks, each of said block feeding conductors extending along the logic regions of the associated block;

a first programmable switch array associated with each of said pluralities of block feeding conductors for selectively connecting said block feeding conductors to sub-row conductors associated with the sub-row which includes the block associated with said block feeding conductors;

a second programmable switch array associated with each of said logic regions for selectively connecting the input terminals of said logic region to block feeding conductors associated with the block which includes said logic region;

a third programmable switch array associated with each of said logic regions for selectively applying the logic output signal of said logic region to sub-row and column conductors respectively associated with the sub-row and column which include the block that includes said logic region; and a fourth programmable switch array associated with each adjacent pair of sub-rows in each row for selectively connecting sub-row conductors associated with one of the associated pair of sub-rows to sub-row conductors associated with the other of the associated pair of sub-rows.

2. The apparatus defined in claim 1 wherein each of said third programmable switch arrays includes a programmable switch for selectively connecting a column conductor associated with the column of blocks which includes the logic region associated with said third programmable switch array to a sub-row conductor associated with the sub-row which includes the block including the logic region associated with said third programmable switch array.

3. The apparatus defined in claim 1 wherein said second programmable switch array is capable of selectively connecting each input terminal of the associated logic region to less than all of the block feeding conductors associated with the block which includes said logic region, and wherein said apparatus further comprises:

a programmable logic connector connected in circuit relation between said logic regions in each of said blocks and the third programmable switch arrays associated with said logic regions in that block for programmably selectively changing the logic region that each of said third programmable switch arrays is associated with.

* * * * *